United States Patent [19]

Smith et al.

[11] Patent Number: 5,500,591
[45] Date of Patent: Mar. 19, 1996

[54] METHODS AND APPARATUS FOR DETECTING SUBSTANCES CONTAINING NUCLEI OF A FIRST AND SECOND KIND

[75] Inventors: John A. S. Smith, London, England; Julian D. Shaw, Encinitas, Calif.

[73] Assignee: British Technology Group Ltd., London, England

[21] Appl. No.: 140,082

[22] PCT Filed: Apr. 30, 1992

[86] PCT No.: PCT/GB92/00798

§ 371 Date: Mar. 21, 1994

§ 102(e) Date: Mar. 21, 1994

[87] PCT Pub. No.: WO92/19979

PCT Pub. Date: Nov. 12, 1992

[30] Foreign Application Priority Data

May 2, 1991 [GB] United Kingdom ............... 9109592

[51] Int. Cl.⁶ .................................................. G01R 33/20
[52] U.S. Cl. ............................................ 324/307; 324/300
[58] Field of Search ........................ 324/300, 322, 324/318, 307, 309, 314, 313; 128/653.2, 653.5

[56] References Cited

U.S. PATENT DOCUMENTS

| | | | |
|---|---|---|---|
| 4,168,462 | 9/1979 | Ernst | 324/307 |
| 4,803,432 | 2/1989 | Perman | 324/309 |
| 4,887,034 | 12/1989 | Smith | 324/307 |
| 5,010,300 | 4/1991 | Paley et al. | 324/322 |
| 5,079,504 | 1/1992 | Machida | 324/309 |
| 5,117,187 | 5/1992 | Granot | 324/309 |
| 5,229,722 | 7/1993 | Rommel et al. | 324/307 |
| 5,233,300 | 8/1993 | Buess | 324/307 |
| 5,274,331 | 12/1993 | Macovski | 324/307 |

FOREIGN PATENT DOCUMENTS

| | | |
|---|---|---|
| 0277745 | 8/1988 | European Pat. Off. |
| 2057135 | 3/1981 | United Kingdom |
| 2200462 | 8/1988 | United Kingdom |
| 2220269 | 1/1990 | United Kingdom |

OTHER PUBLICATIONS

Fukushima and Roeder "Experimental Pulse NMR" pp. 47–124, and 297–424 425–508, (1981).
WO,A,8 404 173 (Southwest Research Institute) 25 Oct. 1984 see p. 4, line 34–p. 7, line 10.

*Primary Examiner*—Sandra L. O'Shea
*Assistant Examiner*—Raymond Y. Mah
*Attorney, Agent, or Firm*—Cushman, Darby & Cushman

[57] ABSTRACT

A method for detecting the presence of a substance in a heterogeneous sample or article (i.e., a contraband substance) in a magnetic field includes establishing a level-crossing condition ($B_{LC}$) for the substance to be detected for a set time ($t_b$), and subsequently measuring nuclear magnetic resonance (NMR) signals to detect some consequence of the level-crossing condition. A saturating signal is applied at the begining of each cyclic test. Apparatus for detecting the presence of predetermined substances is also disclosed.

20 Claims, 4 Drawing Sheets

METHODS AND APPARATUS FOR DETECTING SUBSTANCES CONTAINING NUCLEI OF A FIRST AND SECOND KIND

FIELD OF THE INVENTION

This invention relates to methods and apparatus for detecting the presence of specific substances which contain atomic nuclei of a first kind which can show nuclear magnetic resonance (NMR) effects in a magnetic field and which also contain atomic nuclei of a second kind which can show nuclear quadrupole resonance (NQR) effects. Such substances include, for example, various drugs such as heroin or cocaine, and explosives such as TNT, RDX, HMX and PETN.

BACKGROUND OF THE INVENTION

Nuclei of the first kind usually have spin quantum number equal to one half, and in particular include the nuclei $^1H$, $^{19}F$ and $^{31}P$ which can give readily detectable NMR effects in appropriate conditions. In a magnetic field such nuclei may precess around the direction of the field with a frequency given by $$\omega = \gamma B \text{ where } \omega = 2\pi f,$$

f is the resonant frequency, $\gamma$ is the gyromagnetic ratio of the nuclei and B is the strength of the applied magnetic field. If the nuclei are irradiated with electromagnetic waves at or very close to their resonant frequency f, they can exchange energy with the electromagnetic waves by changing the angle between the direction of their magnetic moment and the direction of the applied magnetic field. When such irradiation ceases the nuclei tend to return towards an alignment parallel to the applied magnetic field, emitting radiation of frequency f. This proceeds as a relaxation process with a time constant called the spin-lattice relaxation time $T_1$ which depends on the processes available for the loss or conversion of their excess energy. The resonant frequency is proportional to the field strength, so it can be tuned to a specified frequency by suitably adjusting the applied magnetic field strength.

Nuclei of the second kind have a spin quantum number greater than one-half and may include for instance $^7Li$, $^9Be$, $^{11}B$, $^{14}N$, $^{23}Na$, $^{27}Al$, $^{35}Cl$, $^{39}K$, $^{55}Mn$, $^{59}Co$, $^{75}As$, $^{79}Br$, $^{81}Br$, $^{127}I$, $^{197}Au$, $^{209}Bi$. They can show detectable nuclear quadrupole resonance effects at resonance frequencies which are mainly determined by the nature of the nuclei and the sub-molecular environment which they are situated. In any compound, the nature and disposition of adjacent nuclei and electrons produce sub-molecular electric field gradients which interact with the nuclear electric quadrupole moments of the nuclei so as to determine one or more quadrupole resonance frequencies. These quadrupole resonance frequencies therefore depend on and indicate the chemical environment as well as the nuclear species involved. The quadrupole resonances are modified by temperature and pressure and may be shifted by an externally applied magnetic field to an extent dependent on the gyromagnetic ratio of the quadrupolar nuclei involved. For some nuclei (e.g. $^{14}N$) this gyromagnetic ratio is small and hence the chemical environment is the main factor determining the quadrupolar resonances in relatively low applied magnetic fields.

Where nuclei of the first kind are also present, particularly if their gyromagnetic ratios are much larger than those of any quadrupolar nuclei present, the applied magnetic field strength can be readily adjusted to make the NMR frequency of the first nuclei equal to an NQR frequency of the second nuclei. This is called a level-crossing field strength; in such conditions energy can readily be exchanged between the first nuclei and the second nuclei, and this changes the span-lattice relaxation time constant $T_1$ of the first nuclei significantly. In some cases this time constant may be reduced by several orders of magnitude by setting the applied magnetic field to a level-crossing field strength. In other cases the effect may be much less but still substantial enough to be used as the basis of methods for detecting the presence of specific substances.

DESCRIPTION OF RELATED ARTS

Various cyclical methods have been devised in which some consequence of setting a level-crossing field condition for a set time is then measured indirectly through its effect on a subsequent nuclear magnetic resonance measurement. For instance GB Patent No. 2057135 and U.S. Pat. No. 4887034 describe some relatively complicated methods and state that these methods may be used to detect the presence of substances such as the drugs and explosives previously mentioned.

SUMMARY OF THE INVENTION

Three simpler methods according to the present invention will be described hereinafter. These methods generally involve a comparison of results from some cycles, called A-cycles, in which the level-crossing field-strength is used with the results from other cycles, called B-cycles, in which a field-strength offset from the level-crossing field-strength Is used. Signals from the NMR nuclei in the substance to be detected, if it is present in the sample or article being examined, will be affected by the difference between the A-cycles and the B-cycles. Consequently a difference between the A-cycle results and the B-cycle results may indicate the presence of the substance to be detected. However, the -wanted signals will generally be superimposed on stronger NMR signals from other nuclei in the sample or article being examined. Any drift or variation in these other signals may be misinterpreted as a difference between A-cycles and B-cycles.

When such methods are used to check unknown parcels or luggage it is likely that the items being examined may include nuclei of the first kind in many different substances, and such nuclei may show NMR effects with various relaxation time constants, and with various level-crossing effects if they are in substances also containing any quadrupolar nuclei. For instance there may be nuclei subject to NMR effects which under the selected test cycle conditions have spin-lattice relaxation times comparable with or longer than the cycle time of the method used, and the unwanted response signals from such nuclei may take perhaps ten cycles to reach equilibrium. Also there may be nuclei which have significant level-crossing effects at field strengths which occur at one or more times in the cycle, and these may produce unwanted superimposed signals which may take a number of cycles to reach equilibrium.

One way to avoid errors arising from these effects would be to ignore the responses from a number of cycles after the commencement of each test and after any change in the test conditions (including any change from A-cycles to B-cycles), and to use only results from tests which appear to have reached equilibrium. However, this would unduly prolong the test procedure, and could make it too long for some applications.

The present invention seeks to provide improved methods and apparatus for the detection of specific substances in heterogeneous samples and articles containing other-substances which could cause confusingly variable NMR signals.

According to the present invention there is provided a method for detecting the presence of a specific substance in a heterogeneous sample or in an article by cyclic tests in a magnetic field wherein a level-crossing condition for the substance to be detected is established for a set time and NMR signals are subsequently measured to detect some consequence of the level-crossing condition, with a saturating signal (as herein defined) being applied before each cyclic test.

The use of saturating radio frequency irradiation is disclosed in U.S. Pat. No. 4168462.

Saturation is a term used to describe a situation in which nuclei with nuclear spin (for example, spin-½ nuclei) exist in an externally applied magnetic field in two or more allowed states and there are equal numbers of the nuclei in each state. A saturating signal in this context means an irradiating signal (including a sequence of individual irradiating signals) of electromagnetic waves of one or more frequencies (at, close to or adjacent the resonant frequencies of the nuclei in the presently applied magnetic field), of sufficient power and duration to create as nearly as possible equal populations of nuclei in all the energy states. In the case of spin-½ nuclei, this means populations of close to 50% in both spin levels. It should be noted that the total population of spin-½ nuclei to be considered must include all spin-½ nuclei in the sample or article being examined which can show NMR effects at or close to the frequency or frequencies being used in the magnetic field which is being applied. For the testing of samples or articles which may contain an unknown variety of substances in which there may be many nuclei in different environments, the saturating signal should be made sufficient to ensure saturation in any material which could be present.

The saturating signal may be a long pulse of continuous wave irradiation or one or more (at least one) short pulses of higher power. It can be shown theoretically that the power in a continuous-wave saturating signal must be large enough to make $\gamma^2 B_f^2 T_1 T_2 \gg 1$ for the nuclei concerned, where $\gamma$ is their gyromagnetic ratio, $T_1$ and $T_2$ their spin-lattice and spin-spin relaxation time constants, and $B_f$ is the peak amplitude of the radiofrequency electromagnetic field produced in the sample by the saturating signal. For common substances $B_f$ should usually be greater than 20 milligauss (2.0 millitesla) and saturation may be achieved in about 5 seconds. To give a shorter testing time it is preferable to use a series of higher-power pulses separated by intervals which are slightly greater than $T_2$. Typically a series of about ten to fifteen pulses of optimized timing, duration and r.f. phase relationship could constitute a saturating signal. The pulse intervals could typically be about 50 μs and saturation may be achieved in less than 1 millisecond. It is convenient to use pulses of the same power and duration as are used to induce free induction decay (f.i.d.) or spin-echo signals in the measurement step of the cycle.

An adequate saturating signal applied immediately before each cyclic test will standardize the situation at a set time prior to each measurement and will therefore standardize the unwanted superimposed signals from nuclei other than the NMR nuclei in the substance to be detected. When an adequate saturating signal is used prior to each cycle, all the test results may be used immediately with no waiting to reach equilibrium conditions and a desired sensitivity and reliability may be achieved with a shorter series of tests. The invention thereby makes such methods applicable for the routine checking of luggage, freight and postal packages with minimal delay.

The application of a saturating signal at the beginning of each cycle has the additional advantage that it greatly reduces any responses from nuclei which have spin-lattice relaxation times longer than the cycle time.

Three comparatively simple methods incorporating the invention will now be explained.

In the first of these methods the strength of the magnetic field is initially set to a value which is not a level-crossing field-strength for the substance to be detected and the cyclic tests comprise the steps of a) applying a saturating signal (as herein defined), b) changing the magnetic field strength to a level-crossing field strength for the substance to be detected and maintaining this level-crossing field strength during a time interval which is less than about ½ $(T_1)_{OFF}$ but greater than about ½ $(T_1)_{LC}$ where $(T_1)_{LC}$ is the spin-lattice relaxation time constant of the NMR nuclei in the substance to be detected when it is in the level-crossing field and $(T_1)_{OFF}$ is its value in a magnetic field offset from the level-crossing field strength, c) changing the magnetic field strength to a different strength convenient for NMR measurements, applying one or more pulses of electromagnetic irradiation at or close to the NMR frequency of the NMR nuclei in the present magnetic field and measuring NMR response signals induced by the one or more pulses. Usually the field strength in this step will be the same as was set up for step (a) at the beginning of the cycle, so that the next cycle can begin immediately after the measuring actions have been taken.

The above sequence of steps, using a level-crossing field in step (b), will be called an A-cycle. Preferably the method will also include some sequences called B-cycles in which the field strength used in step (b) is set to a selected value which is offset from the level-crossing field strength, and the responses from the A-cycles are compared with the responses from the B-cycles.

The method may include A-cycles and B-cycles alternately (ABABAB . . . ) or alternating in pairs (AABBAABB . . . ) or in sets (AA . . . BB . . . AA . . . BB . . . ). The offset field strength may be selected with sufficient offset to give a substantially longer relaxation time for the NMR nuclei in the substance to be detected, and to be well away from any field strength which could be a level-crossing field for any species of quadrupolar nuclei in any other substance which is likely to be present in the samples or articles to be tested.

The one or more pulses applied and the response signal measurements made in the last step of each cycle may be selected in accordance with any established NMR detection technique, for instance as described by Fukushima and Roeder in their book. "Experimental Pulse NMR" (Addison-Wesley 1981).

This first simple method is highly suitable for detecting substances in which $(T_1)_{LC}$ is very much smaller than $(T_1)_{OFF}$. For instance in the explosive RDX the $^{14}N$ nuclei have $(T_1)_{LC}$ significantly less than one second, and have $(T_1)_{OFF}$ of about 60 seconds in a field offset by just 4% from the level-crossing field strength at which the proton resonance frequency is about 5.1 MHz. The low value of $(T_1)_{LC}$ which applies in step (b) in the A-cycles of this method allows the excited NMR nuclei to quickly lose energy. In cases where the level-crossing field strength is comparatively high, it promotes a realignment of the nuclei as they lose energy, producing a remagnetization which increases the response signals measured in step (c) of each A-cycle. This applies for the detection of the explosives HMX and RDX and for these cases step (b) may immediately follow the saturation signal. However, in cases where the level-crossing field strength is relatively low, the realignment and remagnetization (which are proportional to the field) may be slower and less significant. For such cases (for instance in the detection of TNT or PETN) it is preferable to delay step (b), maintaining the original field strength for a time comparable to or greater than $(T_1)_0$, the spin-lattice relaxation time of the NMR nuclei in this field strength, so that a substantial remagnetization will develop before the field strength is reduced. Then in step (b) although the level-crossing condition promotes an exchange of energy between the spin-½ nuclei and the quadrupolar nuclei, the comparatively low field strength means that magnetization is actually lost. It is reduced more quickly in the level-crossing field than in the offset field, so that the responses measured in the A-cycles are in these cases less than the responses in the B-cycles if the substance is present. This situation is so different it may be regarded as a second method of testing.

The third simple method is suitable for detecting substances in which the difference between $(T_1)_{LC}$ and $(T_1)_{OFF}$ is comparatively small, and when the level-crossing field strength is comparatively low, for instance TNT (trinitrotoluene), heroin or cocaine. In this method a magnetic field strength $B_0$ which is not a level crossing field-strength for the substance to be detected is applied, and the cyclic tests comprise the steps of:

a) applying a saturating signal (as herein defined) and maintaining the field-strength $B_0$ for a time $t_0$ greater than $(T_1)_0$ from the end of the saturating signal, where $(T_1)_0$ is the spin-lattice relaxation time of NMR nuclei in the substance to be detected in the field strength $B_0$, b) then reducing the magnetic field-strength to zero in such a manner that it will be at or close to one or more level-crossing field strengths at which the resonance frequency of NMR nuclei in the substance will equal a resonance frequency $f_Q$ of quadrupolar nuclei in the substance for a time or times comparable with $T_{QLC}$ which is the cross-polarization time constant of the quadrupolar nuclei and the NMR nuclei in the level-crossing field strength or field strengths, c) in a zero magnetic field, irradiating with electromagnetic waves at or close to one or more of the resonance frequencies $f_Q$, d) increasing the magnetic field-strength in such a manner that it will be at or close to one or more of the level-crossing field-strengths for a time or times comparable with $T_{QLC}$, e) and in a relatively high magnetic field strength, applying one or more pulses of electromagnetic radiation at or close to the NMR frequency of the NMR nuclei in the present magnetic field strength and measuring NMR response signals induced by the said one or more pulses. Usually the field strength in this step will be the same strength $B_0$ as set up for step (a).

The above sequence constitutes an A-cycle for the third method. Preferably the method will also include B-cycles in which the irradiation frequency in step (b) is offset from the NQR frequency to some frequency which is not likely to be an NQR frequency for any nuclei in any substance likely to be present. As the time constant $T_{QLC}$ may be quite small and less than the times taken to decrease the magnetic field strength from $B_0$ to zero and to increase it again from zero to $B_0$, it may not be necessary to hold the magnetic field strength at any level-crossing value during any distinct pauses. It will be enough to ensure that the magnetic field strength remains in the vicinity of the (or each) level-crossing field-strength for a time comparable with a corresponding time constant $T_{QLC}$ in the course of each change. Where this does not apply and the field-strength is held at the level-crossing field strength for definite times, an alternative form for the B-cycles could use a selected magnetic field strength offset from the level-crossing field strength during these times.

In this third method the NMR (spin-½) nuclei achieve a significant realignment before the magnetic field is reduced to zero. When the level-crossing conditions occur as the field strength is decreased, this realignment is substantially reduced as the quadrupolar nuclei will exchange energy with the NMR nuclei. In the zero-field condition in the A cycles the irradiation at the NQR frequency imparts energy to the quadrupolar nuclei of the substance to be detected if it is present. In the level-crossing conditions which occur as the field strength is increased, some of this energy is transferred to the NMR nuclei, further reducing their average alignment and therefore reducing the response signals in the subsequent measurement.

It will be appreciated from the foregoing that, in the present invention, the interval between the saturating signal and the establishment of the level-crossing condition need not be sufficient for the magnetization to equilibrate; and indeed it is preferably shorter than this, in order to reduce the test duration. Actually, the level-crossing condition may be established substantially immediately after its respective saturating signal.

According to another aspect of the present invention, there is provided apparatus for detecting the presence of a specific substance in a heterogeneous sample or article, including:

means for subjecting the sample or article to a controllable and variable magnetic field;

means for applying radiofrequency pulses to excite nuclear resonance in the sample or article;

means for measuring the resonance response signals;

control means for operating the apparatus to perform cyclic tests and including means for controlling the applying means to apply a saturating signal to the sample or article at the beginning of each cyclic test; and means for indicating the presence of the substance in dependence on the measured response signals.

The apparatus may also include means for applying pulsed radiofrequency electromagnetic waves at or close to a resonance frequency of quadrupolar nuclei in the substance to be detected.

BRIEF DESCRIPTION OF THE DRAWINGS

Embodiments of the invention will now be described by way of example with reference to the accompanying drawings of which.

DESCRIPTION OF PREFERRED EMBODIMENTS

Figure 1:
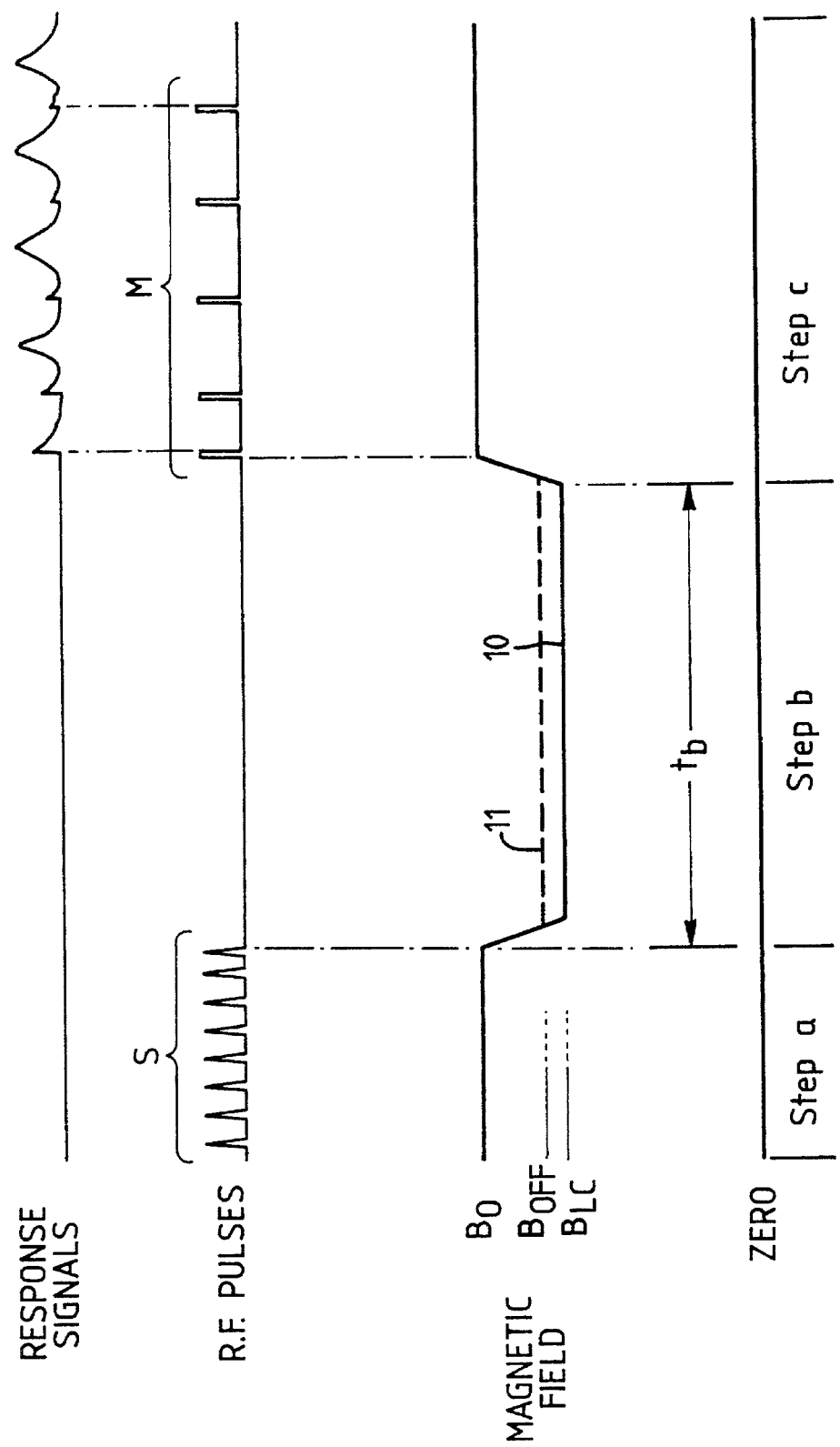
FIGS. 1, 2 and 3 are graphical diagrams Illustrating three methods of testing.

FIG. 1 shows diagrammatically the conditions applied in the first simple method of testing described above. The lowest trace shows the magnetic field strength variations, the middle trace shows pulses representing the amplitudes of the applied radiofrequency signals, and the top trace indicates the free induction decay and spin-echo response signals which may be measured. At the beginning of each cycle the magnetic field has a strength $B_0$ and the pulses marked S represent a saturating signal, which may typically consist of ten pulses shorter than 50 µs duration, 50 µs apart. Immediately after these pulses the magnetic field strength is changed. In the A-cycles it is changed to the level-crossing field strength $B_{LC}$ as shown by the solid trace 10, but in the B-cycles it is changed to an offset value $B_{OFF}$ as indicated by the broken trace 11. In most cases $B_{LC}$ and $B_{OFF}$ will be less than $B_0$ as shown but it is conceivable that the method could alternatively be used, in some cases where $B_{LC}$ and $B_{OFF}$ may be comparatively large, with $B_0$ less than $B_{LC}$. The duration $t_b$ of step (b) in which the magnetic field is held at $B_{OFF}$ or $B_{LC}$ is not shown to scale. It should be greater than $\frac{1}{2}(T_1)_{LC}$ and less than $\frac{1}{2}(T_1)_{OFF}$ and may typically be, 200 milliseconds.

The pulses marked M preferably form a series carefully controlled to produce spin-echo response signals which will depend on the state of the NMR (spin-½) nuclei at the end of step (b). Alternatively a single pulse could be used to induce a single free induction decay signal. The response signals from a number of A-cycles and an equal number of B-cycles will be measured and a sustained difference between the results from the A-cycles and the B-cycles may be taken as an indication of the presence of the substance to be detected. This method is effective for the detection of the explosives HMX and RDX.

Figure 2:
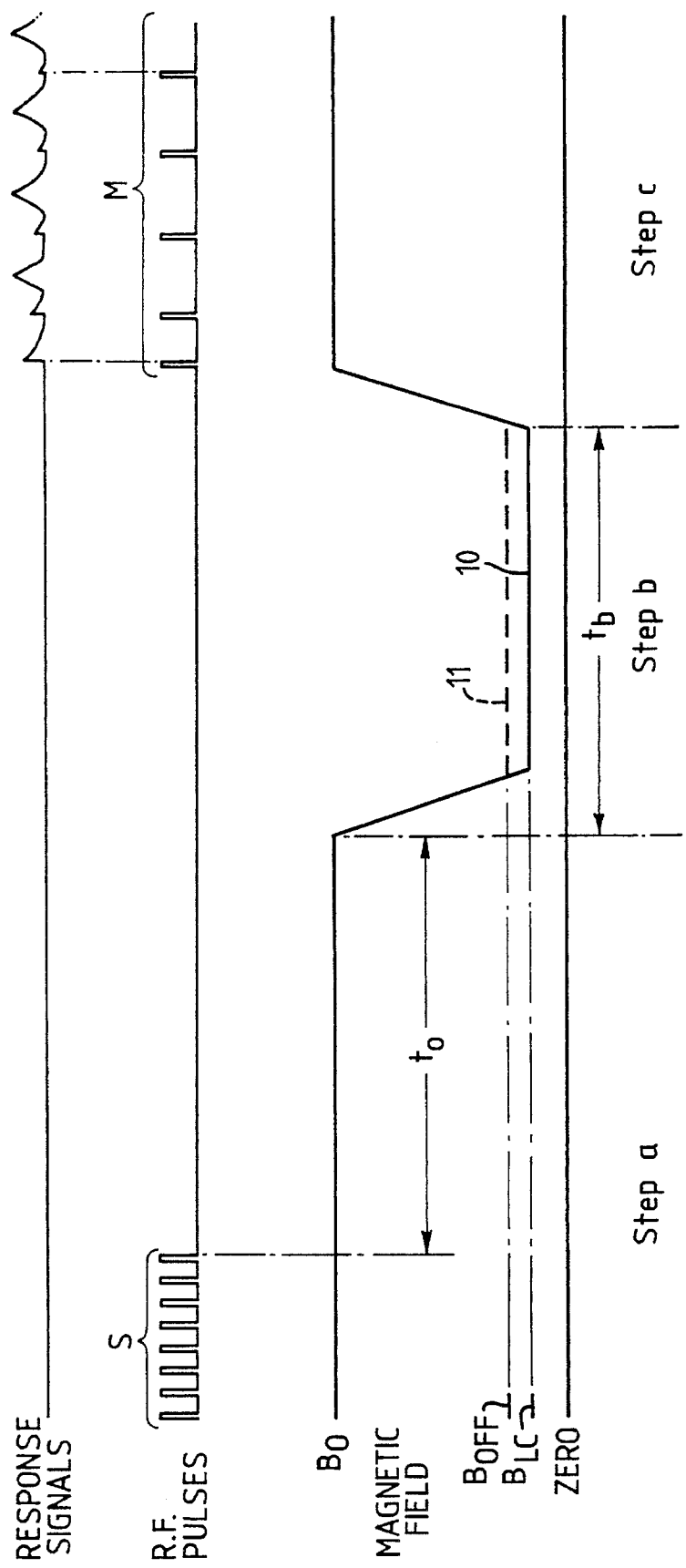

FIG. 2 illustrates the conditions of the second method, where the magnetic field reduction is delayed for a time $t_o$, and the level-crossing field-strength $B_{LC}$ will be closer to zero. This method is applicable to the detection of explosives TNT and PETN.

Figure 3:
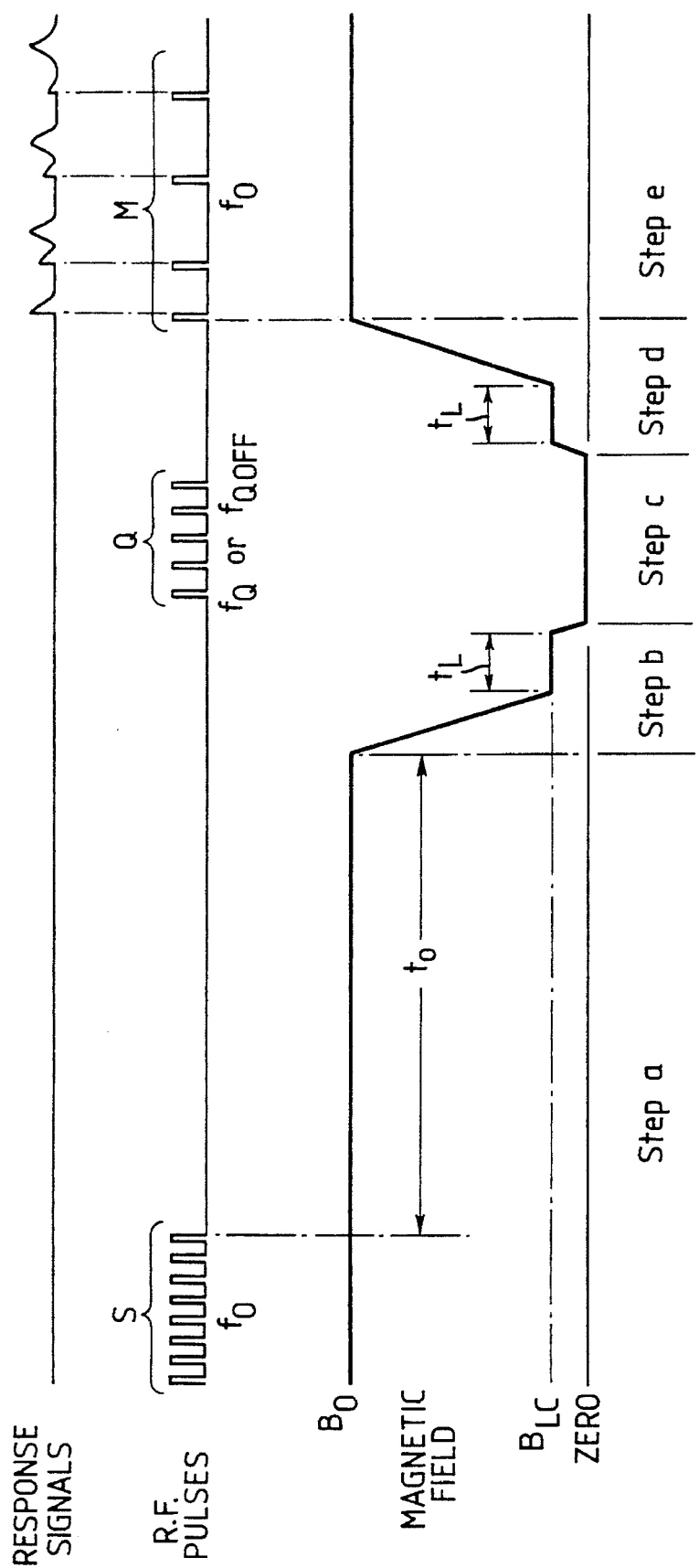

FIG. 3 similarly illustrates the conditions applied in the third simple method of testing described above. In this case the magnetic field strength is maintained at the value $B_0$ for a time $t_0$ after the end of the saturating signal S. This time $t_0$ should be comparable with $(T_1)_0$; for instance in the range from $\frac{1}{4}(T_1)_0$ to $3(T_1)_0$, and it may typically be one to ten seconds. Then the magnetic field strength is reduced to zero and radiofrequency radiation, either pulsed or continuous wave, at one or more frequencies at or close to the quadrupole resonance frequency $f_Q$ are applied in the A-cycles. In the B-cycles a slightly different frequency or frequencies $f_{QOFF}$ will be used. (Note that these frequencies $f_Q$ and $f_{QOFF}$ will be distinctly different from $f_0$, the NMR frequency in field strength $B_0$, which is used for the S and M pulses). As shown the magnetic field strength is held at the level crossing strength $B_{LC}$ for a short time $t_L$ during its increase and decrease, but it may not be necessary to have these distinct pauses if the time constant $T_{QLC}$ is short enough. Measurements are made in the $B_0$ field as before. This method is suitable for detecting TNT, PETN, heroin or cocaine when the frequencies $f_Q$ and field strengths $B_{LC}$ are set appropriately for the substance to be detected.

Figure 4:
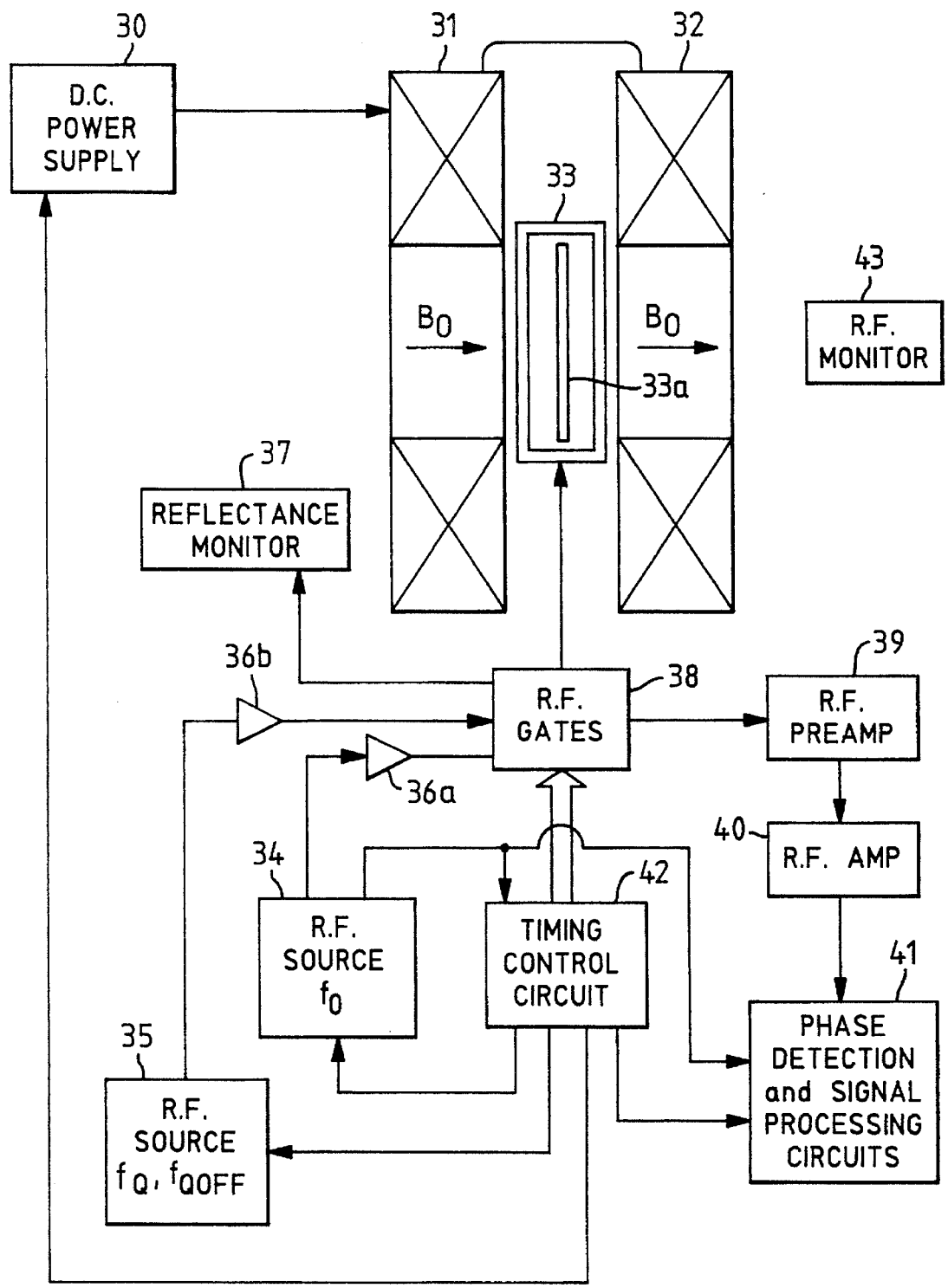
FIG. 4 Is a block circuit diagram showing suitable apparatus for performing such tests.

FIG. 4 shows suitable apparatus for these methods of testing. A controllable DC power supply 30 is connected to coils 31,32 of a large electromagnet arranged to produce a magnetic field $B_0$ in the horizontal direction on the drawing. A tuned radiofrequency coil 33 in the form of a solenoid or a pair of coils in a Helmholtz or similar configuration is mounted in the gap between coils 31,32. This r.f. coil (or coils) 33 is placed to produce a field transverse to the field $B_0$, and is shown diagrammatically in cross-section 33.

Samples or articles to be tested will be placed within or passed through the r.f. coil (or coils) 33. The r.f. coil 33 will be tuned and matched to the r.f. supply circuits at the frequency $f_0$ of the NMR resonance in the field strength $B_0$. If the third method is to be used there will be a second r.f. coil or coil pair 33a which is mounted orthogonally to the coil or coils 33 and to the magnetic field $B_0$. This other r.f. coil or coil pair 33a is tuned and matched at the frequencies $f_Q$ and $f_{QOFF}$ and will be used to carry the Q pulses of FIG. 3. Radiofrequency sources 34,35 which may be oscillators or frequency synthesizers provide pulses of r.f. signals at the frequencies $f_0, f_Q$, or $f_{QOFF}$ as required. These r.f. pulses are applied through tuned r.f. power amplifiers 36a and 36b to r.f. gate circuits 38. A reflectance monitor 37 is provided to , indicate any reflections of the r.f. signals. It is used for tuning purposes, and also to indicate if any conducting or ferromagnetic material in the sample or article being tested is adversely affecting the tests. The r.f. gate circuits 38 connect the r.f. outputs as required to the tuned r.f. coil or coil pair 33 (or to the other tuned coil 33a in the case of the Q pulses in the third method) and also connect the r.f. coil or coil pair 33 through an r.f. preamplifier 39 and amplifier 40 to phase sensitive detection and signal processing circuits 41 at appropriate times for the detection and measurement of the free induction decay or spin-echo response signals. Timing control circuits 42 are connected to control the operations of the r.f. sources 34,35, the magnet D.C. power supply 30, the r.f. gate circuit 38 and the phase detection and signal processing circuits 41. The r.f. source 34 also supplies a signal of frequency $f_0$ as a reference to the timing circuits 42 and phase detection and signal processing circuits 41. An r.f. monitor circuit 43 is also connected to a probe (not shown) to monitor the r.f. irradiation applied to the samples or articles under examination. This r.f. monitor 43 and the reflectance monitor 37 are used to confirm that suitable tuning and matching conditions are maintained and to detect if any ferromagnetic or conducting materials in the samples or articles are adversely affecting the testing process.

It will be understood that the present invention has been described above purely by way of example, and that modifications of detail can be made within the scope of the invention.

We claim:

1. A method for detecting a presence of a specific substance in an object, said specific substance containing a first type nuclei which exhibits nuclear magnetic resonance effects and a second type nuclei which exhibits nuclear quadrupole resonance effects, by a cyclic test comprising a plurality of cycles, each cycle of said cyclic test comprising steps of:

applying a saturating signal to said object;

exposing said object to a magnetic field having a level-crossing field strength with respect to said specific substance to be detected for a set time, said magnetic field having said level-crossing strength causing energy to be exchanged between said first type nuclei and said second type nuclei of said specific substance; and detecting nuclear magnetic resonance signals from said object.

2. A method as claimed in claim 1, wherein said saturating signal is a short train of high-power pulses.

3. A method for detecting a presence of a specific substance in an object, said specific substance containing a first type nuclei which exhibits nuclear magnetic resonance effects and a second type nuclei which exhibits nuclear quadrupole resonance effects, by a cyclic test, wherein each cycle of said cyclic test comprises steps of:

exposing said object to a magnetic field having a first strength;

applying a saturating signal to said object;

exposing said object to said magnetic field having a level-crossing field strength with respect to said specific substance to be detected for a set time, said magnetic field having said level-crossing strength causing energy to be exchanged between said first type nuclei and said second type nuclei of said specific substance; and detecting nuclear magnetic resonance signals from said object;

said first strength of said magnetic field being not equal to said level-crossing field strength, and at least one cycle of said cyclic test includes an A-cycle which further comprises the steps of:

maintaining said magnetic field at said level-crossing field strength during a time interval which is less than about $\frac{1}{2}(T_1)_{OFF}$ but greater than about $\frac{1}{2}(T_1)_{LC}$ where $(T_1)_{LC}$ is a first spin-lattice relaxation time constant of said first type nuclei in said specific substance when said specific substance is in said magnetic field having said level-crossing field strength, and $(T_1)_{OFF}$ is a second spin-lattice relaxation time constant of said first type nuclei in said specific substance when said specific substance is in an offset magnetic field having a strength offset from said level-crossing field strength; and changing said strength of said magnetic field to a strength different from said level-crossing field strength; and applying at least one pulse of electromagnetic irradiation to excite said first type nuclei to nuclear magnetic resonance, said detected nuclear magnetic resonance signals being A-cycle nuclear magnetic resonance signals induced by said at least one pulse.

4. A method as claimed in claim 3, wherein in said A-cycle of said cyclic test, said step of exposing said object to said magnetic field having said level-crossing strength follows immediately after said step of applying a saturating signal to said object.

5. A method as claimed in claim 3, wherein said magnetic field is maintained after said step of applying said saturating signal is completed and before said step of exposing said object to said magnetic field having said level-crossing strength is commenced in each cycle of said cyclic test.

6. A method as claimed in claim 3, wherein at least one cycle of said cyclic test includes a B-cycle which further comprises steps of:

changing said magnetic field to an offset magnetic field strength offset from said level-crossing field strength during a time interval which is less than about $\frac{1}{2}(T_1)_{OFF}$ but greater than about $\frac{1}{2}(T_1)_{LC}$ where $(T_1)_{LC}$ is a first spin-lattice relaxation time constant of said first type nuclei in said specific substance when said specific substance is in said magnetic field having said level-crossing field strength, and $(T_1)_{OFF}$ is a second spin-lattice relaxation time constant of said first type nuclei in said specific substance when said specific substance is in said offset magnetic field strength;

changing said strength of said magnetic field to a strength different from said offset magnetic field strength;

applying at least one pulse of electromagnetic irradiation to excite said first type nuclei to nuclear magnetic resonance, said detected nuclear magnetic resonance signals being B-cycle nuclear magnetic resonance signals induced by said at least one pulse; and comparing said A-cycle nuclear magnetic resonance signals to said B-cycle nuclear magnetic resonance signals to determine said presence of said specific substance.

7. A method for detecting a presence of a specific substance in an object, said specific substance containing a first type nuclei which exhibits nuclear magnetic resonance effects and a second type nuclei which exhibits nuclear quadrupole resonance effects, by a cyclic test, wherein each cycle of said cyclic test comprises steps of:

exposing said object to a magnetic field having a first strength;

applying a saturating signal to said object;

exposing said object to said magnetic field at least one level-crossing field strength with respect to said specific substance to be detected for a set time, said magnetic field having said level-crossing strength causing energy to be exchanged between said first type nuclei and said second type nuclei of said specific substance.; and.

detecting nuclear magnetic resonance signals from said object;

said first strength of said magnetic field $B_0$ being not equal to said level-crossing field strength, and at least one cycle of said cyclic test includes an A-cycle which further comprises the steps of:

maintaining said magnetic field at said first strength $B_0$ for a time $t_0$ greater than $(T_1)_0$ as measured from a completion of said step of applying said saturating signal to said object, $(T_1)_0$ being a first spin-lattice relaxation time of said first type nuclei in said specific substance in said magnetic field having said first strength $B_0$;

reducing said magnetic field strength to zero in such a manner that said magnetic field will be near said at least one level-crossing field strength at which a resonance frequency of said first type nuclei in said specific substance will equal a resonance frequency $f_Q$ of quadrupolar nuclei in said specific substance;

irradiating said object with electromagnetic waves near said resonance frequency $f_Q$, while said object is in a zero magnetic field;

increasing said magnetic field strength in such a manner that said magnetic field will be near said at least one level-crossing field strength; and applying at least one pulse of electromagnetic radiation to excite said first type nuclei to nuclear magnetic resonance, said detected nuclear magnetic resonance signals being induced by said at least one pulse.

8. A method as claimed in claim 7, wherein at least one cycle of said cyclic test includes a B-cycle wherein said electromagnetic waves in said step of irradiating said object with electromagnetic waves is at an offset frequency $f_{QOFF}$ which is offset from said resonance frequency $f_Q$.

9. A method as claimed in claim 8, wherein:

said step of irradiating said object is performed when said object is in said magnetic field held at said at least one level-crossing field strength for at least one predetermined time $t_L$;

said cyclic test including a B-cycle which differs from said A-cycle in that during said at least one predetermined time $t_L$ said magnetic field strength is offset from said level-crossing field strength;

said nuclear magnetic resonance signals detected during said A-cycle being A-cycle nuclear magnetic signals;

said nuclear magnetic resonance signals detected during said B-cycle being B-cycle nuclear magnetic signals;

said method further comprising a step of comparing said A-cycle nuclear magnetic resonance signals to said B-cycle nuclear magnetic resonance signals to determine said presence of said specific substance.

10. A method as claimed in claim 1, wherein said cyclic test includes at least one A-cycle and at least one B-cycle, said A-cycle differing from said B-cycle so that said presence of said specific substance can be detected by a comparison between said nuclear magnetic resonance signals detected during said A-cycle and said nuclear magnetic resonance signals detected during said B-cycle.

11. A method as claimed in claim 10, wherein said magnetic field strength in said step of exposing said object to said magnetic field is at said level-crossing field strength during said A-cycle and instead at a field strength offset from said level-crossing field strength during said B-cycle.

12. A method as claimed in claim 1, wherein said step of exposing said object to said magnetic field having said level-crossing field strength is performed substantially immediately after said step of applying said saturating signal to said object.

13. A method as claimed in claim 1, wherein an interval between performing said step of applying said saturating signal and said step of exposing said object to said magnetic field having said level-crossing field strength is insufficient for a magnetization of said object to equilibrate.

14. A method as claimed in claim 1, wherein an interval between performing said step of applying said saturating signal and said step of exposing said object to said magnetic field having said level-crossing field strength is comparable with $(T_1)_0$ in a range $\frac{1}{4}(T_1)_0$ to $3(T_1)_0$, where $(T_1)_0$ is a spin-lattice relaxation time of said first type nuclei in a field strength $B_0$ at which said saturating signal is applied.

15. Apparatus for detecting a presence of a specific substance in an object, said specific substance containing a first type nuclei which exhibits nuclear magnetic resonance effects and a second type nuclei which exhibits nuclear quadrupole resonance effects, said apparatus comprising:

means for subjecting said object to a controllable and variable magnetic field;

means for applying radiofrequency pulses to excite nuclear resonance in said object causing energy to be exchanged between said first type nuclei and said second type nuclei of said specific substance;

means for detecting said nuclear magnetic resonance as nuclear magnetic resonance response signals;

control means for operating said apparatus so as to perform a cyclic test comprising a plurality of cycles, said control means including means for controlling said means for applying so as to apply a saturating signal to said object at a beginning of each cycle of said cyclic test; and means for indicating said presence of said specific substance in dependence on said nuclear magnetic resonance response signals.

16. Apparatus as claimed in claim 15, further comprising:

means for applying electromagnetic waves near a resonance frequency $f_Q$ of quadrupolar nuclei in said specific substance to be detected, and near an offset frequency $f_{QOFF}$ which is offset from said resonance frequency $f_Q$.

17. Apparatus as claimed in claim 15, wherein said control means operates said apparatus to perform at least one A-cycle test and at least one B-cycle test, said control means comprising means for comparing A-cycle nuclear magnetic resonance response signals detected during said A-cycle test and B-cycle nuclear magnetic resonance response signals detected during said B-cycle test, said comparison indicating said presence of said specific substance.

18. Apparatus as claimed in claim 17, wherein said control means applies said magnetic field at a level-crossing field strength in each A-cycle test and applies said magnetic field at an offset magnetic field strength offset from said level-crossing field strength in each B-cycle test.

19. Apparatus as claimed in claim 15, wherein said control means operates said apparatus so as to apply said magnetic field at a level-crossing field strength substantially immediately after applying said saturating signal, to said object.

20. A method as claimed in claim 1, wherein an interval between performing said step of applying said saturating signal and said step of exposing said object to said magnetic field having said level-crossing field strength is comparable with $(T_1)_0$ in a range $\frac{1}{2}(T_1)_0$ to $2(T_1)_0$, where $(T_1)_0$ is a spin-lattice relaxation time of said first type nuclei in a field strength $B_0$ at which said saturating signal is applied.

\* \* \* \* \*